United States Patent [19]

Moore

[11] Patent Number: 5,175,395
[45] Date of Patent: Dec. 29, 1992

[54] ELECTROMAGNETIC SHIELD

[75] Inventor: Larry V. Moore, Richardson, Tex.

[73] Assignee: Rockwell International Corporation, Seal Beach, Calif.

[21] Appl. No.: 800,188

[22] Filed: Nov. 27, 1991

[51] Int. Cl.⁵ .............................................. H05K 9/00
[52] U.S. Cl. ............................ 174/35 R; 174/35 MS; 361/424; 361/415
[58] Field of Search .......... 174/35 R, 35 GC, 35 MS; 361/400, 424, 390, 415; 49/475, 478

[56] References Cited

U.S. PATENT DOCUMENTS

| | | | |
|---|---|---|---|
| 4,384,165 | 5/1983 | Loving, Jr. et al. | 174/35 GC |
| 4,754,101 | 6/1968 | Stickney et al. | 174/35 R |
| 5,008,487 | 4/1991 | Shimmyo | 174/35 R |
| 5,014,160 | 5/1991 | McCoy, Jr. | 361/424 |

Primary Examiner—Leo P. Picard
Assistant Examiner—Bot L. Ledynh
Attorney, Agent, or Firm—V. Lawrence Sewell; H. Fredrick Hamann

[57] ABSTRACT

An electromagnetic shield for components mounted to a printed circuit board includes an electrically conductive wall for interconnection to the printed circuit board for generally surrounding the components. The wall includes a top edge. The wall is disposed generally perpendicular to the printed circuit board. An electrically conductive cover for covering the area surrounded by the wall includes a top portion disposed generally parallel to the printed circuit board and a flange disposed generally parallel to the wall. The top portion of the cover includes a plurality of spaced apart springs disposed along the periphery of the cover for selectively engaging the top edge of the wall when the cover is positioned to enclose the area surrounded by the wall.

3 Claims, 1 Drawing Sheet

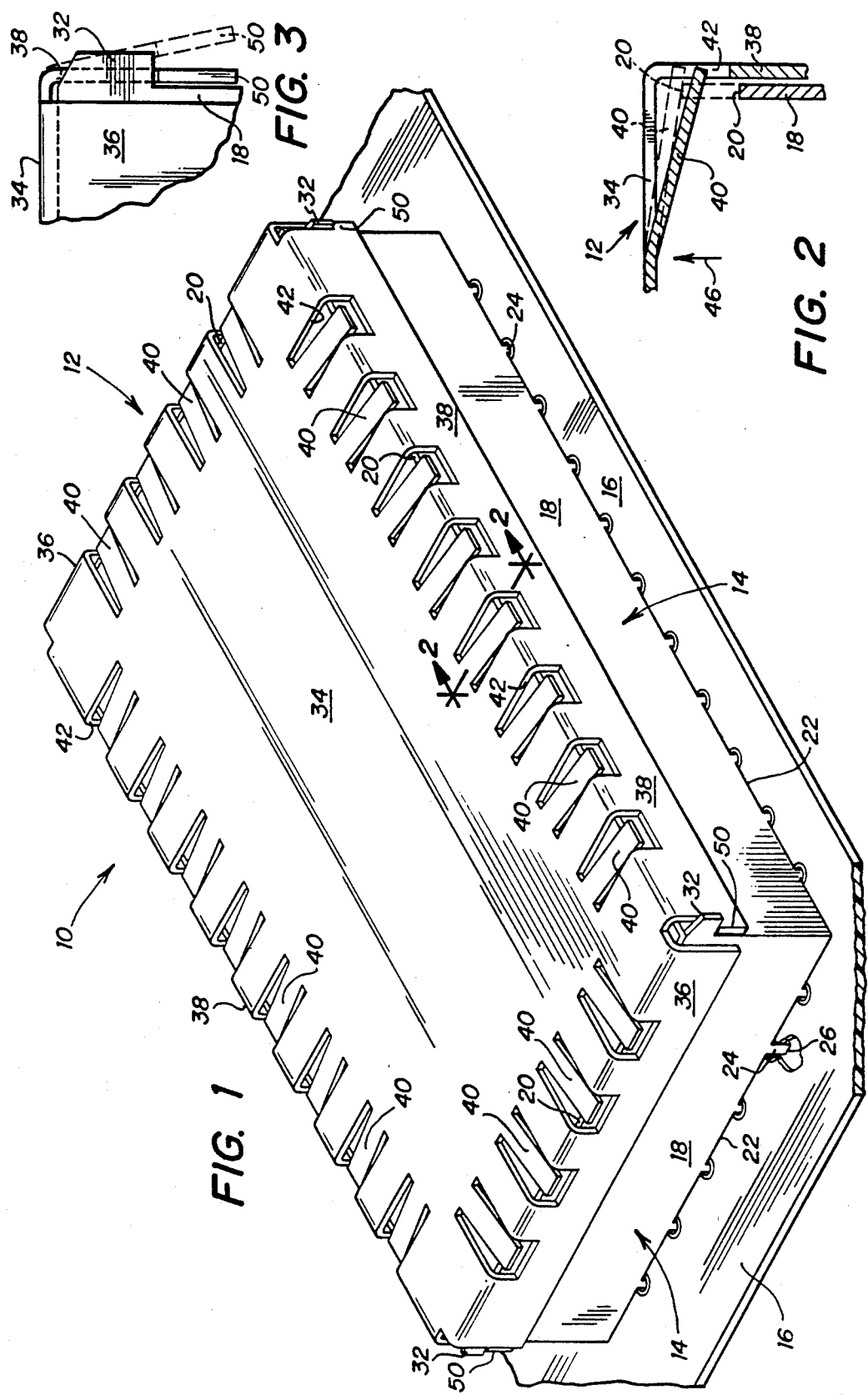

ELECTROMAGNETIC SHIELD

TECHNICAL FIELD OF THE INVENTION

This invention relates to shielding devices, and more particularly, to a shield for minimizing electromagnetic interference and susceptibility effects on electrical and electronic devices having a self captivating cover with integral springs.

BACKGROUND OF THE INVENTION

Electronic components found in various types of transmitters, receivers, computers, and other electronic devices emit or are susceptible to electromagnetic radiation. It is therefore desirable to shield circuit components to reduce undesirable electromagnetic interference (EMI) and/or susceptibility effects with the use of conductive shields that reflect or dissipate electromagnetic charges and fields. Such shields are generally grounded to allow electrical charges and fields to be dissipated without disrupting the operation of the electronic components enclosed within the shield.

Various types of shielding devices for electronic components have been proposed; however, these devices have not been entirely satisfactory for components mounted on printed circuit boards. Components mounted on printed circuit boards are frequently enclosed within a frame or packaging that supports the components being shielded. The frame surrounds the circuit board components and a cover may be provided for enclosing the printed circuit board components. Various problems exist in the connection of the cover to the frame for use and periodic removal of the cover for visual inspection of the printed circuit board and components enclosed by the shield. Mechanical attachment devices between the cover and frame are cumbersome and do not provide sufficient retention of the cover for shock and vibration applications.

A need has thus arisen for an electromagnetic shield for printed circuit boards which provides effective EMI shielding of components in which a cover and frame are easily and selectively interconnected without the need for fasteners such as screws and the like.

SUMMARY OF THE INVENTION

In accordance with the present invention, an electromagnetic shield for components mounted to a printed circuit board is provided. The shield includes an electrically conductive wall for interconnection to the printed circuit board for generally surrounding the components. The wall includes a top edge. The wall is disposed generally perpendicular to the printed circuit board. An electrically conductive cover for covering the area surrounded by the wall is provided. The cover includes a top portion disposed generally parallel to the printed circuit board and a flange disposed generally parallel to the wall. The top portion of the cover includes a plurality of spaced apart springs disposed along the periphery of the cover for selectively engaging the top edge of the wall when the cover is positioned to enclose the area surrounded by the wall.

BRIEF DESCRIPTION OF THE DRAWINGS

For a more complete understanding of the present invention and for further advantages thereof, reference is now made to the following Description of the Preferred Embodiments taken in conjunction with the accompanying Drawings in which:

FIG. 1 is a perspective view of the present electromagnetic shield;

FIG. 2 is a sectional view taken generally along sectional lines 2—2 of FIG. 1 showing operation of the springs associated with the cover of the present electromagnetic shield; and FIG. 3 is an enlarged view illustrating the locking feature of the present electromagnetic shield.

DESCRIPTION OF THE PREFERRED EMBODIMENTS

Referring simultaneously to FIGS. 1, 2 and 3, the present electromagnetic shield is illustrated, and is generally identified by the numeral 10. Electromagnetic shield 10 includes a cover, generally identified by the numeral 12 and a wall, generally identified by the numeral 14. Shield 10 is designed to encompass and shield one or more electronic components (not shown) that are mounted on a printed circuit board 16. Shield 10 can be used to shield either a portion of printed circuit board 16 or an entire board.

Although shield 10 is illustrated in FIG. 1 as being generally square or a rectangle, it is understood that the present shield 10 can be configured in any shape depending upon the positioning of the electronic components on printed circuit board 16.

Wall 14 includes sides 18, a top edge 20 and a bottom edge 22. Extending from bottom edge 22 of sides 18 are mounting tabs 24. Mounting tabs 24 are received within apertures 26 of printed circuit board 16 for interconnecting wall 14 to printed circuit board 16. Tabs 24 may be soldered to printed circuit board 16 using conventional soldering techniques such as, for example, wave soldering, and can be soldered either to the top or bottom surface of printed circuit board 16. Wall 14 may be fabricated from a single length or strip of metallic material, and has a thickness of, for example, 0.024 inches. The particular selection of material is determined, in part, by the frequency of electromagnetic interference to be shielded.

Protruding outwardly of sides 18 are locking tabs 32, whose operation will be subsequently described.

Cover 12 includes a top portion 34 generally disposed parallel to printed circuit board 16 and downwardly extending flange portions 36 and 38. Flange portions 36 and 38 are disposed generally perpendicular to the surface of printed circuit board 16. Cover 12 may be fabricated from, for example, metal, plated plastic, or composite materials, and is electrically conductive. Cover 12 can have a thickness of, for example 0.024 inches; however, the particular composition and thickness of cover 12 may vary according to the particular application and the frequency of electromagnetic interference being shielded.

An important aspect of the present invention is the provision of a plurality of springs 40 formed in the periphery of top portion 34 of cover 12. Springs 40 are formed within apertures 42 contained within cover 12. Springs 40 are permanently formed inwardly of top portion 34 of cover 12 to form a deflectable member that resists the downward installation motion of cover 12 against wall 14. Springs 40 further provide sufficient contact points to positively contact top edge 20 of wall 14 thereby generating sufficient contact and frictional engagement between cover 12 and wall 14 to prevent cover 12 from moving with respect to wall 14 when installed. The width of springs 40, the number of springs 40 desired, and the spacing between springs 40 are selected based upon the desired EMI shielding requirements.

Referring simultaneously to FIGS. 1 and 2, the operation of springs 40 will now be described. As cover 12 is inserted over wall 14, springs 40 engage top edge 20 of wall 14. This contact deflects springs 40 against their natural bias in the direction of arrow 46. When cover 12 is completely installed over wall 14, spring 40 is located in the position shown in the dotted lines in FIG. 2. Therefore, springs 40 exert a downwardly directed force on wall 14 to ensure positive contact between cover 12 and wall 14.

Referring now to FIGS. 1 and 3, cover 12 is interconnected to wall 14 without the use of fasteners. Flange 38 of cover 12 includes a tab 50. Tab 50 engages tab 32 of side 18 of wall 14 to form a locking device for securing cover 12 to wall 14. As illustrated in FIG. 3, upon interconnection of cover 12 to wall 14, tab 50 and flange 38 are deflected outwardly of wall 18, as shown in dotted lines. Rotation of flange 38 toward side 18 of wall 14 forces tab 50 under tab 32 to thereby prevent removal of cover 12 from wall 14. This interconnection provides a secure mechanical attachment without mechanical fasteners or soldering. In order to selectively remove cover 12 from wall 14, tab 50 is rotated outwardly from under tab 32 in order to allow cover 12 to be removed from wall 14. The interconnection between tabs 50 and 32 further provides a point of contact between cover 12 and wall 14 to aid in shielding.

It therefore can be seen that the present electromagnetic shield provides for efficient EMI shielding of printed circuit board components. The shield of the present invention allows for the visual inspection of components utilizing a removable cover which is self captivating to a shield wall interconnected to the printed circuit board. The present shield is suitable for high volume production techniques and requires little maintenance in use. The cover of the present shield can be removed without damage to the surrounding wall structure which would necessitate repair and replacement of the wall structure of a shield. Therefore, the present invention requires little maintenance after installation.

Whereas the present invention has been described with respect to specific embodiments thereof, it will be understood that various changes and modifications will be suggested to one skilled in the art and it is intended to encompass such changes and modifications as fall within the scope of the appended claims.

I claim:

1. A device for providing electromagnetic shielding for components mounted to a printed circuit board, comprising:

an electrically conductive wall for interconnection to a printed circuit board for generally surrounding the components, said wall includes a top edge and adapted to be disposed generally perpendicular to the printed circuit board;

a removable electrically conductive cover for covering the area surrounded by said wall, said cover including a top portion disposed generally perpendicular to said wall and a flange disposed generally parallel to said wall; and said top portion including a plurality of spaced apart springs disposed in said top portion along the periphery thereof for selectively engaging said top edge of said wall when said cover is positioned to enclose the area surrounded by said wall.

2. The device of claim 1 wherein said springs include a plurality of fingers contained within said top portion of said cover.

3. The device of claim 1 wherein said wall includes a tab and said cover flange includes means for receiving said tab for locking said cover to said wall.

* * * * *